United States Patent [19]

Bohnert et al.

[11] Patent Number: 5,053,693
[45] Date of Patent: Oct. 1, 1991

[54] FIBREOPTICAL SENSOR

[75] Inventors: Klaus Bohnert, Niederrohrdorf; Werner Buser, Basel, both of Switzerland

[73] Assignee: Asea Brown Boveri Ltd., Baden, Switzerland

[21] Appl. No.: 631,439

[22] Filed: Dec. 21, 1990

[30] Foreign Application Priority Data

Dec. 22, 1989 [CH] Switzerland .......................... 4603/89

[51] Int. Cl.$^5$ ........................................... G01R 31/02
[52] U.S. Cl. ....................................... 324/96; 324/72; 324/72.5; 324/244.1; 250/227.14
[58] Field of Search .............. 324/244, 244.1, 72, 324/72.5, 96; 250/227.14, 227.16, 227.19; 350/96.29

[56] References Cited

U.S. PATENT DOCUMENTS

| 4,249,076 | 2/1981 | Bergstrom | 250/227.14 |
| 4,442,350 | 4/1984 | Rashleigh | 250/227.19 |
| 4,495,411 | 1/1985 | Rashleigh | 250/227.19 |
| 4,524,322 | 6/1985 | Bobb | |
| 4,536,088 | 8/1985 | Rashleigh et al. | 250/227.19 |
| 4,591,786 | 5/1986 | Koo et al. | 324/96 |
| 4,665,363 | 5/1987 | Extance et al. | 324/244.1 |
| 4,748,686 | 5/1988 | Glomb | 324/96 |
| 4,918,371 | 4/1990 | Bobb | 324/244.1 |

FOREIGN PATENT DOCUMENTS 0316619 5/1989 European Pat. Off. .
0316635 5/1989 European Pat. Off. .

OTHER PUBLICATIONS

Applied Optics, vol. 19, No. 17, Sep. 1, 1980, pp. 2926-2929, D. A. Jackson, et al., "Elimination of Drift in a Single-Mode Optical Fiber Interferometer Using a Piezoelectrically Stretched Coiled Fiber".

IEEE Journal of Quantum Electronics, vol. QE-18, No. 4, Apr. 4, 1982, pp. 626-665, T. G. Giallorenzi, et al., "Optical Fiber Sensor Technology".

Primary Examiner—Kenneth A. Wieder
Assistant Examiner—William J. Burns
Attorney, Agent, or Firm—Oblon, Spivak, McClelland, Maier & Neustadt

[57] ABSTRACT

In an interferometric fiberoptic sensor with homodyne detection for measuring electrical fields or voltages, the measurement signal is compensated separately from operating point control. The measurement signal originating from the electrical field is compensated in a piezoelectric modulator (5) which consists of modulator elements which are identical with the at least one sensor element (3) with respect to material, geometric shape and crystal orientation. Additional separate apparatus (4) with a sufficiently large phase swing are provided for operating point control. Modulator element and sensor element (3) are essentially at the same temperature so that the temperature-dependence of the matter constants of the sensor element and the temperature-dependence of the fiber interferometer are eliminated. The sensor preferably operates in accordance with the principle of a fiberoptic two-mode interferometer.

10 Claims, 3 Drawing Sheets

FIBREOPTICAL SENSOR

BACKGROUND OF THE INVENTION

1. Field of the Invention

The invention relates to a fibreoptical sensor for measuring electrical fields or voltages, in which
a) a sensor fiber having a given length section is attached to at least one piezoelectric sensor element in such a manner that the electrical field to be measured leads to a change in length of the sensor fiber by means of the inverse piezoelectric effect,
b) means for the interferometric detection of the change in length are provided and
c) a piezoelectric modulator is provided which is driven in such a manner that the change in length of the sensor fiber induced by the electrical field to be measured is compensated.

2. Discussion of Background

The principle of the SMFI (= Single Mode all Fiber Interferometer) is of fundamental significance in the use of fibreoptical sensors in practice. An overview of the background relating to sensor elements and detectors is offered by the publication "Optical Fiber Sensor Technology", Thomas G. Giallorenzi et al., IEEE J. of Quantum Electronics, Vol. QE-18, No. 4, 4th April 1982.

A special case are the piezoelectric field sensors known from Patent Publication EP 0 361 619 A1. These have the characteristic of detecting exclusively one predetermined directional component of an arbitrary electrical field. If, in addition, several such sensors are connected in series in a suitable manner, the voltage between two points in space can be measured in the sense of a line integral over the electrical field. Such a voltage sensor is known, for example, from Patent Publication EP 0 316 635 A1.

A fibreoptical sensor of the type initially mentioned is known, for example, from the publication "Elimination of drift in single-mode optical fiber interferometer using a piezoelectrically stretched coiled fiber", D. A. Jackson et al., Appl. Optics Vol. 19, No. 17, 1st September 1980. This article shows how a SMFI with a piezoelectrically stretched fiber coil can be held at the optimum operating point. The fiber optical arrangement here corresponds to a Mach-Zehnder interferometer. Homodyne detection is preferably used as the detection arrangement. Whilst one arm of the interferometer is exposed to the signal to be measured, a compensator in the second arm ensures that the phase difference between the two arms is calibrated to zero. Having regard to a large dynamic range of the system, a cylindrical piezoelectric ceramic body is used as compensator onto which the fiber is wound.

In the background of the art, the temperature-dependence of the sensor signal represents a fundamental problem. In the operating range from −40° to +70° C. usually required, it results in errors within the range of typically some percent. In the case of quartz-based piezoelectric sensors, for example, the error is a combined temperature-dependence of piezocoefficients, dielectric constants and fiber interferometer, assuming that the compensator material is kept at a constant temperature.

SUMMARY OF THE INVENTION

It is the object of the invention to specify a fibreoptical sensor of the type initially mentioned, which avoids the disadvantages with respect to temperature dependence existing in the prior art.

According to the invention, the object is achieved by the fact that
the piezoelectric modulator comprises at least one piezoelectric modulator element which is identical with the at least one sensor element with respect to material, geometric shape and crystal orientation,
modulator element and sensor element are essentially at the same temperature and
separate means for operating point control are additionally provided.

The core of the invention lies in the fact that the components $S(t)$ (signal) and $\phi(t)$ (arbitrary phase term) of the total optical phase shift $\Phi(t)=S(t)+\phi(t)$, which results from the change in length of the fiber, are separately compensated. The required signal $S(t)$ is compensated by means of a modulator which is identical with the detecting sensor with respect to material and geometry. If sensor and modulator are kept at approximately the same temperature, the resulting output signal (=control signal of the modulator) is thus largely free of temperature influences. This is because both sensor element and modulator element have identical characteristics in this case (piezocoefficients, dielectric constants). The electrical field to be measured and acting in the sensor element can thus only be calibrated by a field of the same or a proportional intensity - dependent on the ratio of the number of turns - in the modulator.

The operating point of the fibreoptical sensor according to the invention is kept to a value $\Phi(t)=(2n+1)\pi/2$.

Thus, the additional means for operating point control can be dimensioned for the thermal drift $\phi(t)$ which is generally large and slow in comparison with the signal $S(t)$, independently of the sensor materials with their frequently rather small piezo coefficients.

The invention thus also creates a method for measuring an electrical field or an electrical voltage, in which
a) light, which is conducted in a sensor fiber, is subjected to a phase shift due to a change in length of the sensor fiber induced by means of a piezoelectric sensor element,
b) the phase shift is interferometrically detected and
c) calibrated to zero by means of a piezoelectric modulator acting on the sensor fiber in accordance with a control signal, the intensity of the field or of the voltage, respectively, being determined from the control signal, which is characterized by the fact that
d) modulator elements are used in the modulator which are identical with the piezoelectric sensor element with respect to material, geometric shape and crystal orientation,
e) sensor and modulator elements are kept at the same temperature, and
f) a separate operating point controller with a large phase swing is used for operating point control so that a dynamic range of at least $+/-2\pi$ is achieved.

In the text which follows, some preferred embodiments of the invention are specified.

Various detection concepts are suitable for the invention. In any case, however, it is advantageous if sensor element and modulator act on the same glass fiber, namely the sensor fiber. In this manner, the fluctuations of the detected signal can be kept smaller than if sensor element and modulator act on different glass fibers.

Apart from a Mach-Zehnder interferometer, a two-mode interferometer, briefly TNFI (= Two Mode Fiber Interferometer), is especially preferred since, on the one hand, no expensive fiber couplers are needed in such an arrangement and, on the other hand, the number of splices can be kept small. In addition, no reference fiber is needed.

Because of its long-time stability and its good availability, quartz is very suitable as sensor element material. Directionally sensitive sensors as are known, for example, from the previously quoted publication EP 0 316 619 A1 are especially preferred. They have the advantage that a predetermined directional component of the electrical field can exclusively lead to a change in length of the fiber. Field components which are perpendicular to the predetermined directional component cannot lead to a sensor signal. It can thus be ensured that in the sensor no other directional components of the field to be measured have an influence on the signal than in the modulator.

So that larger measurement signals can also be compensated in the modulator with a given maximum possible control voltage, several identical modulator elements are advantageously stacked on top of one another in the modulator, the electrodes of which are electrically driven in parallel. In addition, the sensor fiber can be mounted with a greater length section at each modulator element than at the corresponding sensor element. The resultant high translation ratio is of advantage particularly in the case of high-voltage applications.

The means for controlling the operating point can be implemented in various manners.

A first preferred possibility is represented by a piezoceramic (PZT) hollow cylinder around which the sensor fiber is wound in several turns. The advantage of this piezoelectric solution lies in the fact that no moving parts are needed (as is the case with the mechanical fiber stretchers).

A mechanical fiber stretcher represents a second possibility. In this device, the sensor fiber is fixed at two spaced-apart points so that the intermediate section can be stretched in dependence on the compensation signal. The stretching is preferably produced by means of an electromagnet, a bimetallic element or a stepping motor in conjunction with a worm drive. These mechanical fiber stretchers have the advantage that they require only little fiber length (typically less than 0.3 m).

Finally, a third possibility consists in that the wavelength of the laser light used for detection is varied. Operating point control can here be carried out with additional components. In particular, no moving parts are needed. Finally, the fiber requirement is also less.

The means for interferometric detection are preferably constructed in accordance with the principle of homodyne detection. A first PI controller having an upper cut-off frequency above a frequency (for example 5 kHz) of the electrical field to be measured (industrial alternating field) drives the modulator. A second PI controller having a cut-off frequency below the said frequency (for example 0–10 Hz) controls the operating point. According to a particularly preferred embodiment, a reset circuit is additionally provided which resets the second PI controller (returned by $2\pi$ or a predetermined multiple thereof), if its modulation range is exceeded.

The invention is also suitable for measuring electrical voltages if the sensor element is constructed in the manner of a field integrator.

The invention is preferably used for measuring fields or voltages, respectively, in gas-insulated switchgear. In this case, the approximately equal temperature can be ensured by the fact that the sensor elements are mounted on the inside and the modulator elements on the outside on the metallic outer tube.

Further preferred embodiments are obtained from the description following.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DESCRIPTION OF THE PREFERRED EMBODIMENTS

Figure 1:
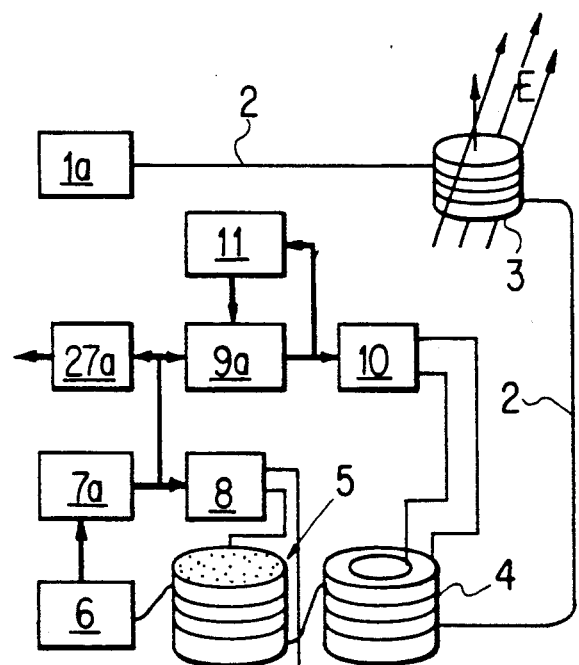
FIG. 1 shows a diagrammatic representation of a fibreoptical sensor for measuring electrical fields.

Referring now to the drawings, wherein like reference numerals designate identical or corresponding parts through the several views, in FIG. 1 a first illustrative embodiment of the invention is shown. The diagrammatically shown fibreoptical sensor is used for measuring an electrical field E (for example an alternating field having a given frequency).

A laser 1a couples coherent light of a predetermined frequency (or wavelength respectively) into a sensor fiber 2. According to a particularly advantageous embodiment, this is a Two Mode Fiber, briefly called TMF. In it, the light of the laser 1a is conducted in two modes which are subjected to a different phase shift with an elongation of the fiber. The elongation of the sensor fiber 2 is effected by means of at least one piezoelectric sensor element 3. For this purpose, the sensor fiber 2 is attached with a given length section to the sensor element 3 preferably in such a manner that one predetermined directional component of the electrical field exclusively can lead to a change in length of the sensor fiber 2 by means of the inverse piezoelectric effect.

A large number of such directionally sensitive sensor elements is described, for example, in the previously quoted publication EP 0 316 619 A1. A round disk-shaped sensor element of monocrystalline quartz is particularly preferred, in which a crystallographic dyad axis of rotation (x direction) is oriented perpendicularly to the main face of the sensor element. The sensor fiber 2 is wound several times around the disk. The sensor element is thus only sensitive to field components which are parallel to the disk normal.

The differential phase shift of the two modes, induced by the electrical field E, is compensated in accordance with the invention, in which arrangement a signal needed for the compensation can be used as a measure of the field strength to be measured. Compensation is effected in two separate steps. In the present example, the operating point is set in the first step and the signal induced by the electrical field E is compensated in the second step.

The means for operating point control preferably comprise a piezoceramic operating point controller 4, which has previously been used for general modulation purposes and is known, for example, from the article by D. A. Jackson et al., already mentioned. According to the invention, an operating point controller 4 is formed by a large relatively thin-walled hollow cylinder of PZT (piezoceramics) around which the sensor fiber is wound several times. On the inside and the outside, the hollow cylinder is in each case provided with a layer-like electrode. If a voltage is applied to this, the circumference of the hollow cylinder and thus the length of the sensor fiber 2 changes. So that the operating point controller 4 can be driven with voltages which are as small as possible (preferably <1 kV) with a given number of fiber turns, the wall thickness must be kept small (for example 1-2 mm) and the diameter must be kept large (some cm, for example 5 cm).

The operating point controller 4 is followed by a modulator 5. This modulator exhibits at least one modulator element 12a which is identical with the sensor element 3 with respect to material, geometry and crystallographic orientation. From a production point of view, it can be of advantage if the body dimensions are also identical.

According to the present illustrative embodiment, the modulator element 12a is thus also disk-shaped and of monocrystalline quartz of the crystallographic orientation mentioned. In contrast to the sensor element 3, however, the modulator element 12a is coated with one electrode each at its two main faces. In addition, the sensor fiber 2 is preferably attached with a larger number of turns than at the sensor element 3, resulting in a type of translation. This means that a lower field strength is needed at the modulator element in order to produce the same phase shift as in the sensor element.

An important point in the invention is the provisions ensuring that sensor and modulator elements are at approximately the same temperature. This ensures that the matter constants (for example piezocoefficients, dielectric constants) of the modulator element essentially do not differ from those of the corresponding sensor element. The control signal of the modulator element is thus largely free of temperature errors and can be used directly for determining the electrical field strength. The evaluation is handled by an evaluating circuit 27a.

The allowable magnitude of the temperature difference between modulator and sensor element depends on the required measuring accuracy. Fibreoptical sensors according to the invention are typically required to be operated in a temperature range from $-40°$ C. to $+70°$ C. In this range, temperature-related errors of several percent can occur. In order to largely eliminate these errors, the temperature difference should be no more than a few degrees Celsius.

In practice, this is sufficiently well ensured if, for example, sensor and modulator element are both exposed to the same environmental conditions. In the special case of gas-insulated switchgear, for example, this can be implemented in such a manner that the sensor element is attached to the inside and the modulator element is attached to the outside of the shielding metallic outer tube.

At the end of the sensor fiber 2, detection means 6 are arranged. They typically comprise two photodetectors and one difference forming circuit. It outputs a signal which corresponds to the coherent optical heterodyning of the two eigenmodes conducted in the sensor fiber 2. The signal of the detection means 6 is used for driving, on the one hand, the modulator 5 and, on the other hand, the operating point controller 4. The aim of the driving is that the output signal of the difference forming circuit is always kept at zero. The detection is thus always tuned for the point of highest sensitivity. In the text which follows, the drive according to the invention will now be described in detail.

According to a preferred embodiment, the signal detection is effected by means of a homodyne detection method, known per se. Two photodetectors measure the optical interference signals (which result from the heterodyning of the fundamental mode with a first-order mode) and generate two electrical voltages phase-shifted by 180°

$$V_1 = V_0(1 + a\cos\Phi(t))$$

$$V_2 = V_0(1 - a\cos\Phi(t))$$

$$\Phi(t) = S(t) + \phi(t)$$

The total phase shift $\Phi(t)$ between the two interfering waves or modes, respectively, is composed of a component $S(t)$ caused by the electrical field E to be measured and an arbitrary phase term $\Phi(t)$. The latter slowly changes (if no operating point control is effected) with time due to temperature-related fluctuations of the fiber length. The quantity $V_0$ is proportional to the optical input power and $a$ is a measure of the interference contrast.

From the two voltages $V_1$ and $V_2$, a difference signal $$V_3 = V_2 - V_1 = 2\ V_0 \cos \Phi(t)$$

is formed and output at the output of the detection means 6 to a first PI controller 7a. The first PI controller 7a generates a first control signal which is supplied as control voltage to the modulator 5 via an amplifier 8. The control signal is proportional to the signal $S(t)$ and ensures that the phase shift $S(t)$ caused by the electrical field to be measured is continuously calibrated to zero. The phase shift induced by the sensor element is consequently just compensated by the modulator via a corresponding (opposite) change in length of the sensor fiber.

The evaluating circuit 27a is thus restricted to multiplying the difference signal $V_3$ with a particular proportionality factor, resulting in the desired value for the strength of the field E.

A particular feature of the invention is the separation of the compensation of signal and temperature drift. To compensate for the temperature drift, a second PI controller 9a and a second amplifier 10 are provided. The second PI controller 9a is connected in series with the first PI controller 7a. It has an upper cut-off frequency of 5 − 10 Hz so the second control signal supplied to the second amplifier 10 (or the voltage applied to the piezoceramic operating point controller 4 by the amplifier 10, respectively) ensures that all fluctuations of the phase shift in the frequency band below the upper cut-off frequency are balanced out by the operating point controller 4.

The cut-off frequency of the first PI controller 7a for driving the modulator is above the frequency of the measured signal (which is generally an industrial alternating-current frequency), for example 5 kHz. This PI controller compensates all phase shifts in the frequency band between its own cut-off frequency and the cut-off frequency of the second PI controller 9a.

With strong temperature fluctuations, the thermally induced component $\phi(t)$ of the optical phase shift (even in the case of the TMFI which is less sensitive in comparison with the Mach-Zehnder interferometer) can be many multiples of $2\pi$ and thus far exceed the dynamic range of the operating point controller 4. To avoid the associated problems, the means for operating point control preferably comprise a reset circuit 11. This ensures that the second PI controller 9a is reset by a predetermined value when the PI controller 9a reaches a predetermined maximum positive or negative limit value. This unloading of the PI controller 9a corresponds to a displacement of the operating point of the interferometer by a multiple of $2\pi$. It follows that the dynamic range of the operating point controller 4 must at least correspond to a displacement of the said operating point by $+/-2\pi$.

A suitable embodiment of the operating point controller in this sense is formed, for example, by means of a piezoceramic hollow cylinder having a diameter of 50 mm and wall thickness of 2 mm which is polarized in the radial direction and, at the same time, has the following piezo coefficients:

$$d_{33} = 565 \ 10^{-12} \ m/V$$

$$d_{31} = -230 \ 10^{-12} \ m/V$$

$$d_{15} = 730 \ 10^{-12} \ m/V$$

(VIBRIT 668 by SIEMENS)

With a maximum voltage swing of $+/-1$ kV (field applied in parallel with the direction of polarization of the hollow cylinder), a phase shift of about $+/-20\pi$ can be compensated if 5 m of sensor fiber are wound onto the hollow cylinder.

The illustrative embodiment described with reference to FIG. 1 allows a large number of modifications according to the invention. These will be explained in the text which follows.

Figure 2:
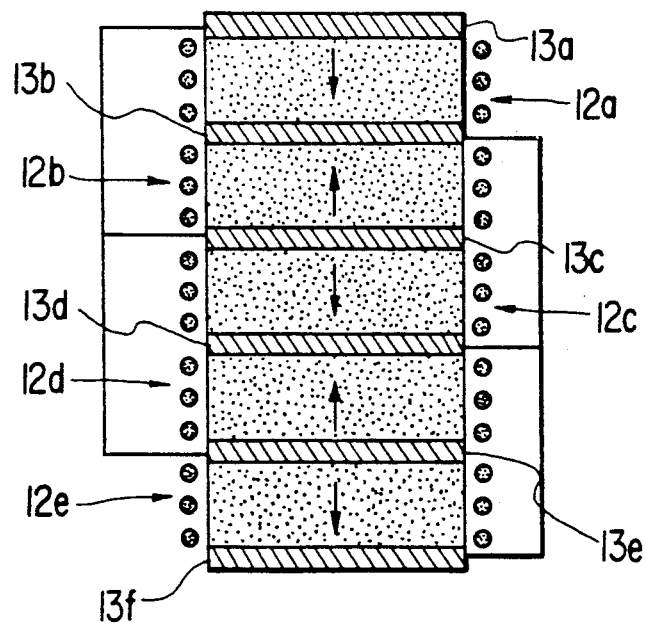
FIG. 2 shows a modulator comprising several modulator elements.

FIG. 2 shows a modulator having several modulator elements 12a, ..., 12e. According to an advantageous embodiment, the modulator elements 12a, ..., 12e are disk-shaped. They are all identical with the sensor element with respect to material, geometric shape and orientation of the crystal axes. They are stacked to form a cylinder. Between the modulator elements 12a and 12b, 12b and 12c, 12c and 12d, 12d and 12e, which rest on one another with main faces, an electrode 13b, 13c, 13d, 13e is in each case arranged. Beginning and end of the cylinder are, furthermore, also provided with an electrode 13a and 13f. Thus, each modulator element is located between two electrodes.

The sensor fiber 2 is wound onto the cylinder in such a manner that the same number of turns are allocated to each element.

The modulator elements 12a, ..., 12e, which are preferably constructed so as to be directionally sensitive, are crystallographically oriented in such a manner that the contributions of the individual elements are added in the correct phase. In the present case, the dyad crystal axes of adjacent modulator elements (indicated by the arrows) are in each case oriented in oppositely identical direction.

The electrodes are connected to the amplifier in such a manner that the full control voltage is present across each modulator element. The first, third and fifth electrode 13a, 13c and 13e in the axial direction of the stack are at the same potential, that is to say they are connected in parallel. This analogously applies to the second, fourth and sixth electrode 13b, 13d and 13f.

The advantage of the multi-layered or stacked modulator lies in the translation ratio which is obtained in this manner between the field strength detected by the sensor element and the voltage to be produced by the amplifier (or field strength predominating in a single modulator element, respectively).

In the case of the SMFI, the signal S(t) is typically 0.1 rad 1 rms. To compensate for this signal, approximately 3 to 5 crystal disks are required, depending on the fiber type, if a) the modulation voltage has a maximum swing of $+/-3$ kV, b) the diameter and the thickness of the disks are 25 mm and 5 mm, respectively, and c) 15 turns of sensor fiber per disk are provided.

The modulator according to FIG. 2 in general and the said parameter values in particular represent preferred embodiments of the invention.

The variations of the invention explained in the text which follows relate to the means for operating point control.

Figure 3:
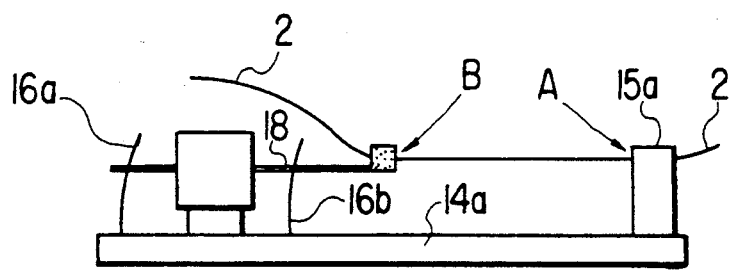
FIG. 3 shows a fiber stretcher, in which the change in length of the sensor fiber is effected mechanically by means of an electromagnet.
Figure 4:
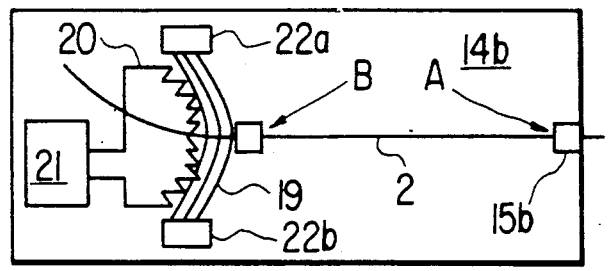
FIG. 4 shows a fiber stretcher in which the change in length of the sensor fiber is effected mechanically by means of a bimetallic stretcher.
Figure 5:
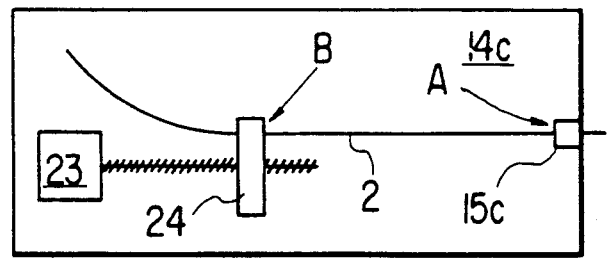
FIG. 5 shows a fiber stretcher in which the change in length of the sensor fiber is effected mechanically by means of a stepping motor in conjunction with a worm gear.

FIGS. 3 to 5 essentially show mechanical fiber stretchers which can be used as an alternative to the piezoceramic hollow cylinder.

FIG. 3 diagrammatically shows a fiber stretcher in which a change in length of the sensor fiber 2 is effected by an electromagnet. On a carrier 14a, a holder 15a is provided by means of which the sensor fiber 2 can be fixed in location at a point A. Means for elongating the sensor fiber 2 are located at a given distance from the holder 15a.

In the illustrative embodiment according to FIG. 3, these means are two leaf springs 16a, 16b and an electromagnet 17 with a shaft 18 arranged between them. On the shaft, the sensor fiber 2 is fixed in location by suitable means at a point B. The shaft 18, which is elastically held in the axial direction by the two leaf springs 16a, 16b pretensions a given length section of the sensor fiber 2, namely the section between the points A and B.

If then the electromagnet 17 is activated by the low-frequency compensation signal (of the second PI controller), the sensor fiber, that is to say the section between the two points A and B, is subjected to a corresponding elongation. The phase shift of the conducted laser light, induced in this manner, compensates for the drift in the arbitrary phase term $\phi(t)$ mentioned.

FIG. 4 shows a further possibility for generating the fiber stretching. The elongation is here effected by a bimetallic element. Analogously to FIG. 3, the sensor fiber 2 is fixed in location by a holder 15b at a point A. At a given distance from this holder 15b, a bimetallic strip 19 is arranged in a holder 22a, 22b on a carrier 14b. It exhibits means for fixing the sensor fiber 2 in location at a point B. The bimetallic strip 19 is in thermal contact with a heating element 20 which is driven by a current source 21.

If the current source 21 is supplied with the output signal of the second PI controller 9a (FIG. 1), the section between the points A and B of the sensor fiber 2 is subjected to the desired drift-compensating change in length due to the thermally induced bending of the bimetallic strip 19.

In the illustrative embodiment of FIG. 4, a Peltier element, for example, can also be used instead of the heating element.

FIG. 5 shows a third also preferred variant of the fiber stretcher. Similar to the preceding examples, a holder 15c for fixing the sensor fiber 2 in location at point A is provided on a carrier 14c. The stretching of the sensor fiber 2, however, is now effected by a stepping motor 23. This drives a worm drive 24 on which, in turn, the sensor fiber 2 is attached at point B. The stepping motor 23 is controlled by a stepping motor control which, in turn, is driven by the second PI controller. In this manner, the desired drift-compensating change in length of the sensor fiber 2 is generated directly.

The mechanical fiber stretchers just described have the advantage that they can manage with a relatively short fiber length. The determining section between points A and B typically has a length of 30 to 50 cm. In any case, the fiber requirement is less than 1 m.

There are further possibilities for compensating for the temperature-dependent arbitrary phase term $\phi(t)$. According to a particularly preferred embodiment, the wavelength of the laser light is varied for this purpose. This will be described in the text which follows, in conjunction with a fibreoptical sensor for measuring a voltage.

Figure 6:
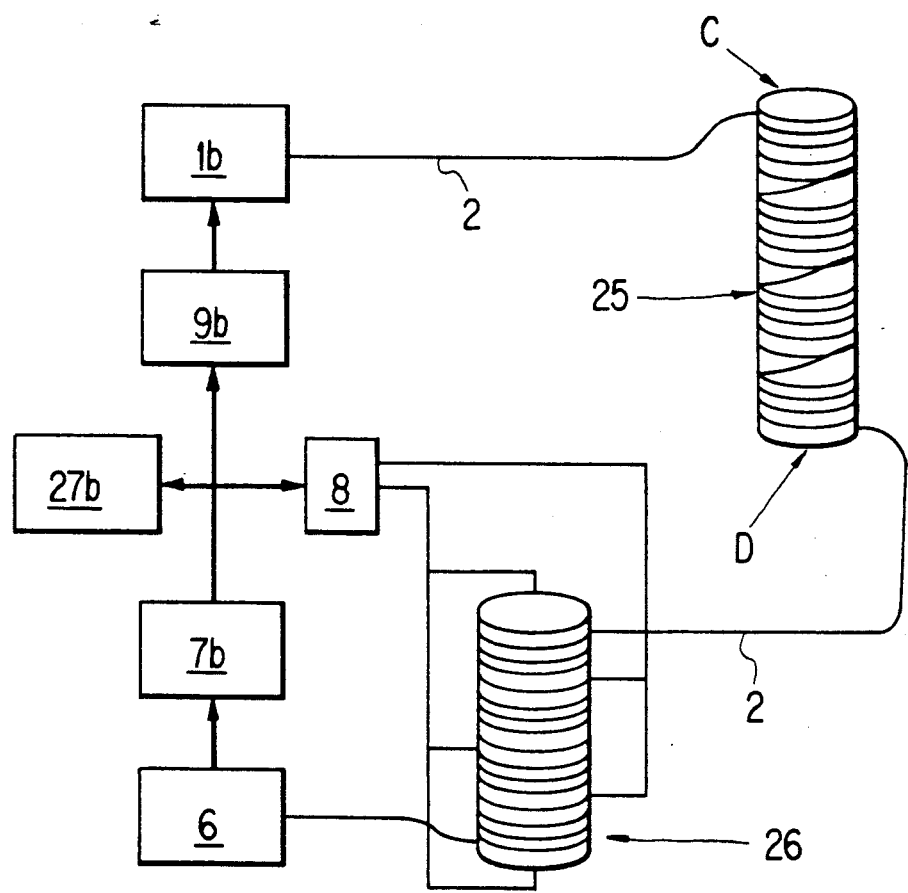
FIG. 6 shows a fibreoptical sensor for measuring electrical voltages.

FIG. 6 diagrammatically shows such a fibreoptical sensor for measuring an electrical voltage. A laser 1b couples light into a sensor fiber 2, for example a TMF. A piezoelectric voltage sensor 25 detects the potential difference between two space points C and D. The voltage sensor 25 as such is known from the previously mentioned printed document EP 0 316 635 A1. It consists of a particular number of directionally sensitive piezoelectric sensor elements which, separated by suitable spacing elements, are arranged behind one another between space points C and D.

If, in accordance with a preferred embodiment, the directionally sensitive sensor elements are disk-shaped, the voltage sensor 25 overall has the shape of a long cylinder. The sensor fiber 2 is wound around this cylinder, care having been taken that the spacing disks themselves cannot produce any field-induced change in length of the sensor fiber 2.

It is particularly advantageous if all sensor elements of the voltage sensor and the spacing disks are identical to one another. The voltage sensor then forms a discretized line integral, where all summands contribute with the same weightings to the total signal.

The following is also to be noted with respect to the voltage sensor. The voltage sensor represents a multi-layered dielectric. The field acting on the individual sensor elements (for example quartz disks) is determined by, among other things, the dielectric constants of the spacing disks. The spacing disks should therefore be of a material which exhibits little or no temperature dependence on the dielectric constants. Otherwise, the electrical field acting on the sensor elements of the voltage sensor becomes temperature-dependent. This temperature-dependence, however, is not compensated by the method described. Such a temperature effect could only be eliminated by corresponding spacing disks also being integrated in the modulator. However, this would lead to an increase in electrode spacings which (due to the lower field strength in the crystal material) would result in a reduction in the maximum achievable compensating phase shift.

For the said reasons, Teflon, polytetrafluoroethylene, tetrafluoroethylenehexafluoropropylene, quartz glass or polyethylene are particularly preferred as materials for the spacing disks.

From the voltage sensor 25, the sensor fiber 2 leads to a modulator 26. This essentially has the structure shown in FIG. 2. For the sake of simplicity, it consists of as few modulator elements as possible. The exact number of modulator elements is obtained from the magnitude of the signal to be compensated and the maximum control voltage in the modulator. The modulator elements are identical, with the sensor elements with respect to material, geometric shape and crystal orientation. Analogously to the first illustrative embodiment, a desired translation ratio between the potential difference to be measured and the control voltage of the modulator can be achieved by a suitable choice of the number of windings per modulator element (and the total number of elements).

From the modulator 26 the sensor fiber 2 leads to the detection means 6. These can be identical with that described with reference to FIG. 1. A difference signal supplied by the detection means 6 is supplied to a first PI controller 7b which emits a control signal to an amplifier 8. The amplifier 8, in turn, drives the modulator 26.

The control signal of the first PI controller 7b is also supplied to a second PI controller 9b and an evaluating circuit 27b (which typically comprise an amplifier for scaling the control signal). The latter determines the voltage between the space points C and D, corresponding to the control signal.

In principle, the same applies to the detection means 6 and to PI controllers 7b, 9b as has been said in connection with the first illustrative embodiment (FIG. 1). However, in deviation from FIG. 1, the second PI controller 9b does not control a fiber stretcher but the wavelength of the laser 1b. In a monomode semiconductor laser, this can either be set via the operating current or the temperature of the laser 1b.

In a monomode laser diode, a change in operating current by 1 mA results in a displacement in wavelength of between 0.01 nm and 0.2 nm, depending on diode type. Similar values are obtained with a temperature change of 1° C. To avoid any jumping between adjacent modes, a current or temperature change in the diode must be restricted to approximately 2 mA or 2° C., respectively.

The following holds true for the differential phase shift $\delta\phi$:

$$\delta\phi = 2\pi l \frac{d}{d\lambda}\left[\frac{1}{L_B}\right]\delta\lambda$$

where
l = length of the sensor fiber
$\delta\lambda$ = shift in wavelength
$L_B$ = beat length
(The beat length is the distance along which a phase shift of $2\pi$ accumulates between the two modes of the sensor fiber).

The expression $$\frac{d}{d\lambda}\left[\frac{1}{L_B}\right]$$

is highly dependent on the wavelength. As always a wavelength (which depends on the fiber core size and the difference in refractive index δn between fiber core and fiber cladding) in which the above-mentioned expression is equal to zero. To obtain a sufficiently large phase shift δφ per change in wavelength δλ, the wavelength of the laser and the fiber parameters must consequently be matched to one another.

For a 10 m-long sensor fiber with δn=0.033, core radius r=1.2 μm and a wavelength μ=830 nm, δφ=36 rad for δ=0.1 nm. This makes it possible to carry out without problems an operating point control according to the invention such as has also been explained with reference to FIG. 1.

Naturally, the operating point control by changing the wavelength is suitable not only for the illustrative embodiment (FIG. 6) just described but also for all other forms of the fibreoptical sensor according to the invention.

The TMFI can also be replaced, for example, by a Mach-Zehnder interferometer. In such an embodiment, the light of the laser is distributed in a manner known per se to the two arms of the Mach-Zehnder interferometer. In this arrangement, one arm is formed by a sensor fiber and the other arm is formed by a reference fiber. The part-signals of the two arms are brought into interference and converted to an electrical difference signal which can then be processed in a manner previously described and used for operating point control or modulation, respectively.

In principle, modulation and operating point control can be optionally performed in the sensor or the reference arm. However, it corresponds to a preferred embodiment of the invention to perform the modulation in the sensor arm. This makes it possible to keep fluctuations of the signal lower. The sensor arm then looks similar to that in FIG. 1 or FIG. 6, respectively, however with the difference that the sensor fiber is not operated as a TMF but as a common monomode fiber. An additional two fiber couplers are then also required for the Mach-Zehnder arrangement which couple a part of the laser light into and out of the reference fiber, respectively.

Compared with the TMFI, the Mach-Zehnder interferometer has the advantage of greater sensitivity. It must be noted with respect to the operating point control by means of changing the wavelength, that the arms of the Mach-Zehnder interferometer must have different lengths. The following relation holds true for the phase shift:

$$\delta\phi = 2\pi\,\delta l\,\delta\lambda/\lambda^2$$

δl = optical path length difference between the arms.
δl = must be smaller than the coherence length of the laser light for correct detection.

For δl −0.01 m, λ=830 nm and δλ=0.1 nm, δφ=9.1 rad is obtained. This is sufficient for being able to carry out the separate operating point control according to the invention.

The following must be noted with respect to the sensor elements. In principle, all types of piezoelectric sensors can be used for the invention. However, the directionally sensitive sensors such as are known, for example, from the publication EP 0 316 619 A1, are especially preferred. This is because whilst in a modulator according to FIG. 2, an electrical field with a well-defined direction is acting on the crystal of the modulator, the direction of the field to be measured is generally unknown. If thus the sensor elements (and thus, according to the invention, the modulator elements, too) are not directionally sensitive, it can happen that the field strength of the field to be measured is not in a well defined relation to the voltage (or to the control signal, respectively) which is applied to the electrodes of the modulator.

From the group of directionally sensitive sensor elements, all those are especially preferred which can be stacked in a simple manner to form a cylindrical or prismatic body. Apart from the disk-shaped elements, this also includes the plate-shaped rectangular sensor elements in which the sensor fiber is fixed in location on one main face (in parallel with one edge of the plate) and which are crystallographically oriented in such a manner that exclusively a field component perpendicular to the plate normal can lead to a change in length of the sensor fiber. Such plate-shaped sensor elements can be stacked up analogously to FIG. 2. However, the sensor fiber then does not extend along the edge but between the individual plates.

For crystal class TD (Schoenflies notation), which includes, among others, the III-V semiconductors (for example GaAs), this means that a tetrad$^{transverse}$ axis of rotation is perpendicular to the plate and the sensor fiber forms a 45° angle with another tetrad$^{transverse}$ axis of rotation.

A further stackable variant is formed by plate-shaped sensor elements in which the sensor fiber is also fixed on a main face parallel to an edge which, however, exhibits a crystallographic orientation of the type where exclusively one directional component parallel to the said main face can lead to a change in length of the sensor fiber. The sensor elements just mentioned are joined to one another, for example, by means of the main faces. The electrodes of the modulator are then attached to the narrow sides, located in one plane, of the crystal plates. In other words, the electrodes are arranged on two mutually opposite longitudinal faces of the prismatic stack.

For the crystal class D3 (Schoenflies notation), which includes, for example, α-quartz, this means that the sensitive directional component is oriented to be parallel with the dyad axis of rotation and the sensor fiber is oriented to be not parallel to the tryad axis of rotation.

A further variant consists in joining the plate-shaped sensor elements of the preceding example to one another with the narrow sides which are located in the direction of the sensitive axis of the respective sensor element. The electrodes of the modulator are then arranged at the adjoining narrow sides, that is to say between the sensor elements (comparable to FIG. 2).

The especially preferred stackable embodiments described can be used to construct effortlessly further examples which are also included within the scope of the invention.

The invention is not restricted to the expressly designated examples. Instead, it also comprises the variants which are obtained by combining the individually explained aspects and variants of the fibreoptical sensor according to the invention.

In conclusion, it can be noted that the invention creates a measuring device which is distinguished by high measuring accuracy due to operating point control, galvanic isolation between sensor and detector and low space requirement.

Obviously, numerous modifications and variations of the present invention are possible in the light of the above teachings. It is therefore to be understood that within the scope of the appended claims, the invention may be practiced otherwise than as specifically described herein.

LIST OF DESIGNATIONS 1a, 1b—laser; 2—sensor fiber; 3—sensor element; 4—operating point controller; 5, 26—modulator; 6—detection means; 7a, 7b, 9a, 9b—PI controller; 8, 10—amplifier; 11—reset circuit; 12a, ..., 12e—modulator element; 13a, ..., 13f—electrode; 14a, 14c—carrier; 15a, ..., 15c holder; 16a, 16b—leaf springs; 17—electromagnet; 18—shaft; 19 -bimetallic strip; 20—heating element; 21—current source; 22a, 22b—holder; 23—stepping motor; 24—worm gear; 25—voltage sensor; 27a, 27b—evaluating circuit.

What is claimed as new and desired to be secured by letters patent of the United States is:

1. Fiberoptic sensor for measuring electrical fields or voltages, in which
   a) a sensor fiber having a given length section is attached to at least one piezoelectric sensor element in such a manner that the electrical field to be measured leads to a change in length of the sensor fiber by means of the inverse piezoelectric effect,
   b) means for the interferometric detection of the change in length are provided and
   c) a piezoelectric modulator is provided which is driven in such a manner that the change in length of the sensor fiber induced by the electrical field to be measured is compensated, wherein
   d) the piezoelectric modulator comprises at least one piezoelectric modulator element which is identical with the at least one sensor element with respect to material, geometric shape and crystal orientation,
   e) modulator element and sensor element are essentially at the same temperature, and
   f) separate means for operating point control are additionally provided.

2. Fiberoptic sensor as claimed in claim 1, wherein the means for the interferometric detection are based on the interference of two modes in a sensor fiber or are constructed in the manner of a Mach-Zehnder interferometer.

3. Fiberoptic sensor as claimed in claim 1, wherein the at least one sensor element and the corresponding at least one modulator element are directionally sensitive.

4. Fiberoptic sensor as claimed in claim 1, wherein
   a) several modulator elements are provided,
   b) the modulator elements can be stacked to form a simple prismatic or cylindrical body, and
   c) are assembled to form a stack in which all modulator elements are connected in parallel.

5. Fiberoptic sensor as claimed in claim 1, wherein
   a) the modulator elements are disk-shaped and of monocrystalline quartz and exclusively detect one component of the electrical field which are parallel to a disk normal, and
   b) they are assembled to form a stack in such a manner that adjacent modulator elements have an oppositely identical orientation and
   c) electrodes for parallel driving of the modulator elements are provided between the modulator elements resting against one another.

6. Fiberoptic sensor as claimed in claim 1, wherein the means for operating point control comprise a fiber stretcher, particularly a piezoceramic hollow cylinder.

7. Fiberoptic sensor as claimed in claim 1, wherein the at least one sensor element and the modulator act on the same sensor fiber.

8. Fiberoptic sensor as claimed in claim 1, wherein the interferometric means comprise a laser having a variable wavelength and the means for operating point control comprise a circuit for controlling the wavelength of the laser.

9. Fiberoptic sensor as claimed in claim 1, wherein
   a) a first PI controller having an upper cut-off frequency above a frequency of the electrical field to be measured is provided for driving the piezoelectric modulator,
   b) the means for operating point control comprise a second PI controller having an upper cut-off frequency below the said frequency and
   c) a reset circuit for resetting the second PI controller in accordance with a phase shift of a multiple of $2\pi$.

10. Process for measuring an electrical field or an electrical voltage, in which
    a) light, which is conducted in a sensor fiber, is subjected to a phase shift due to a change in length of the sensor fiber induced by means of a piezoelectric sensor element,
    b) the phase shift is interferometrically detected, and
    c) is calibrated to zero in accordance with a control signal by means of a piezoelectric modulator acting on the sensor fiber, the intensity of the field or of the voltage, respectively, being determined from the control signal, wherein
    d) modulator elements are used in the modulator which are identical with the piezoelectric sensor element with respect to material, geometric shape and crystal orientation,
    e) sensor and modulator elements are kept at the same temperature, and
    f) a separate operating point controller having a large phase swing is used for operating point control so that a dynamic range of at least $+/- 2n$ is achieved.

* * * * *